United States Patent [19]

Chiang

[11] Patent Number: 5,257,165
[45] Date of Patent: Oct. 26, 1993

[54] PIN GRID ARRAY ADAPTOR MOUNTING HARDWARE

[75] Inventor: Jung-Shan Chiang, Taipei, Taiwan

[73] Assignee: Jaton Technology Co., Ltd., Taipei, Taiwan

[21] Appl. No.: 834,841

[22] Filed: Feb. 13, 1992

[51] Int. Cl.$^5$ .................................................. H05K 1/00
[52] U.S. Cl. ......................................... 361/748; 439/45; 439/78; 174/261; 361/728; 361/737; 361/760; 361/761
[58] Field of Search ............... 361/392, 393, 395, 397, 361/400, 401, 413; 439/44, 45, 68, 71, 78; 174/261, 201; 257/697

[56] References Cited

U.S. PATENT DOCUMENTS

| | | | |
|---|---|---|---|
| 4,618,739 | 10/1986 | Theobald | 174/52 FP |
| 4,750,092 | 6/1988 | Werther | 361/400 |
| 4,914,813 | 4/1990 | Layher et al. | 29/843 |
| 4,933,741 | 6/1990 | Schroedor | 357/70 |

Primary Examiner—Leo P. Picard
Assistant Examiner—Young S. Whang
Attorney, Agent, or Firm—Jacobson, Price, Holman & Stern

[57] ABSTRACT

A PGA adaptor mounting hardware comprising a PGA adaptor which has a plurality of double-head fastening pins and contact pins with flush type contact terminals, and a printed circuit board which has apertures, a printed circuit with conductive points on a top edge thereof, and a transistor circuit on a bottom edge thereof with contact terminals aligned to and electrically connected to the conductive points of the printed circuit for mounting an IC. The printed circuit board is covered with a layer of tin paste over the apertures and the contact terminals of the printed circuit thereby, permitting the PGA adaptor to be connected thereto by inserting the double-head fastening pins into the apertures and, soldering the contact terminals of the contact pins to the conductive points of the printed circuit.

2 Claims, 4 Drawing Sheets

PIN GRID ARRAY ADAPTOR MOUNTING HARDWARE

BACKGROUND OF THE INVENTION

The present invention relates to a PGA (pin grid array) adaptor mounting hardware, and more particularly, the present invention relates to such a PGA adaptor mounting hardware comprised of a PGA adaptor mounted on a printed circuit board at one side permitting a transistor circuit to be made on said printed circuit board at an opposite side for mounting an IC.

A PGA adaptor according to the prior art, as shown in FIG. 5 and 6, is generally comprised of a base plate 20 having a plurality of double-head pins 21 around a peripheral flange thereof for fastening to corresponding soldering holes 23 on a printed circuit board 22 through the process of soldering, which printed circuit board 22 has a transistor circuit with IC on the bottom edge thereof at an off-set location. Because the PGA adaptor is electrically connected to the printed circuit board by the double-head pins 21 of the PGA adaptor, a plurality of soldering holes 23 must be made on the printed circuit board 22 for fastening the double-head pins through the process of soldering. As a consequence, much space on the back side of the printed circuit board shall be provided for mounting the transistor circuit with IC. Therefore, the manufacturing cost for the printed circuit board is relatively increased. Further, using a bigger size of printed circuit board makes its installation inconvenient. Further, after having been installed in a machine, a bigger size of printed circuit board may obstruct the installation of other parts therein.

SUMMARY OF THE INVENTION

The present invention has been accomplished to eliminate the aforesaid disadvantages. It is therefore an object of the present invention to provide a PGA adaptor mounting hardware which permits the two opposite printed circuits of a printed circuit board to be superimposed on each other. It is another object of the present invention to provide a PGA adaptor mounting hardware which connects a PGA adaptor to a printed circuit board through a surface mounting technique permitting a transistor circuit with IC to be made on the printed circuit board at the back side thereof right below the PGA adaptor. It is still another object of the present invention to provide a PGA adaptor mounting hardware which greatly reduces the size and manufacturing cost of a printed circuit board.

According to the present invention, there is provided a PGA adaptor mounting hardware which is generally comprised of a PGA adaptor and a printed circuit board, wherein said PGA adaptor has a plurality of double-head fastening pins and contact pins with flush type contact terminals; said printed circuit board has apertures, a printed circuit with conductive points on a top edge thereof, and a transistor circuit on a bottom edge thereof electrically connected to the conductive points of said printed circuit for mounting an IC. The printed circuit board is covered with a layer of tin paste over the apertures and the conductive points of the printed circuit thereof, permitting the PGA adaptor to be connected thereto by inserting the double-head fastening pins into the apertures and, soldering the contact terminals of the contact pins to the contact terminals of the printed circuit. By means of the aforesaid arrangement, the transistor circuit with the IC can be disposed right below the PGA adaptor, and therefore, the size of the printed circuit board can be greatly reduced.

DETAILED DESCRIPTION OF THE PREFERRED EMBODIMENT

Figures 1, 1A:
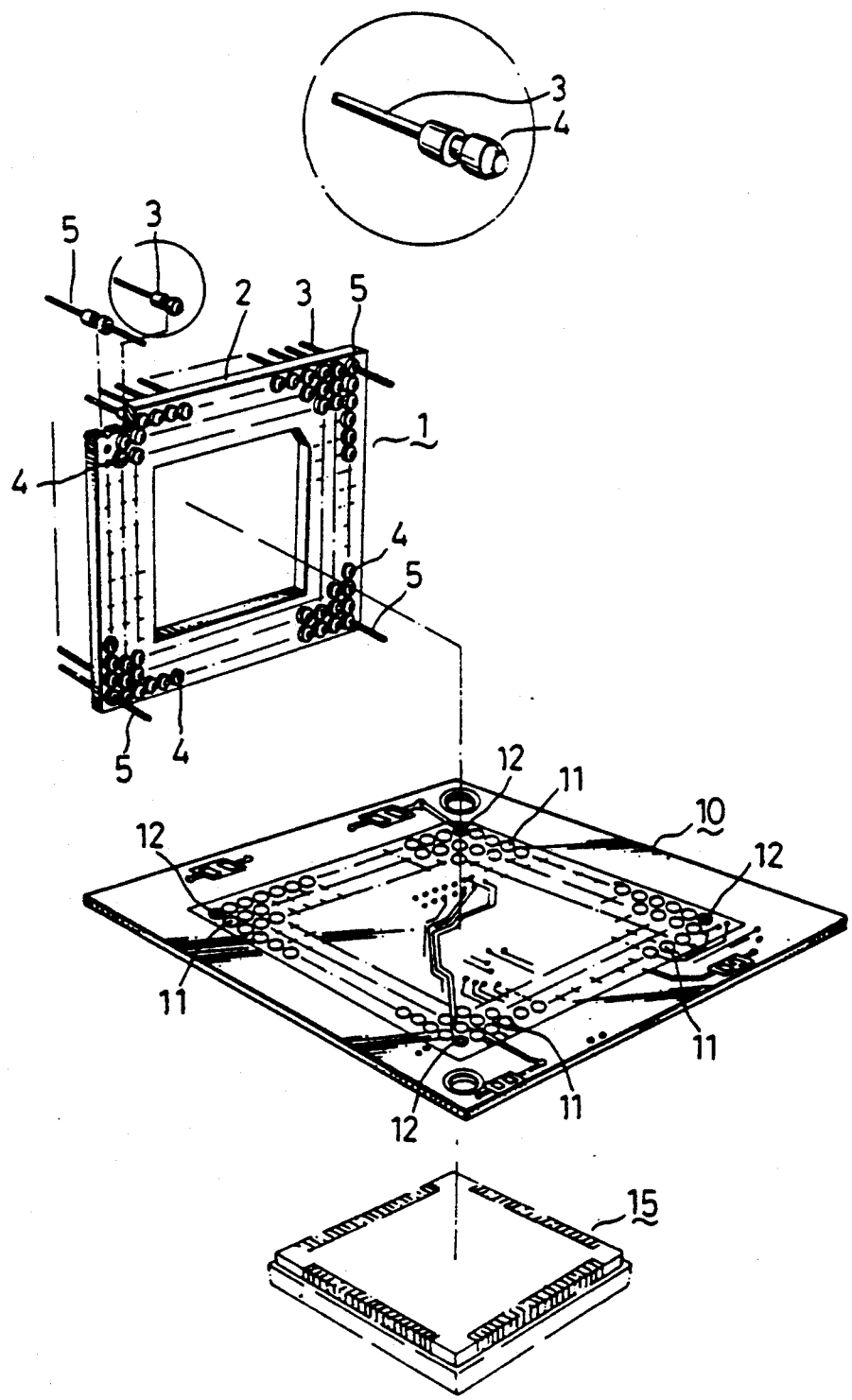
FIG. 1 is an exploded view of the preferred embodiment of the PGA adaptor mounting hardware of the present invention.
FIG. 1A is a perspective view of a contact pin for the PGA adaptor mounting hardware of FIG. 1
Figure 2:
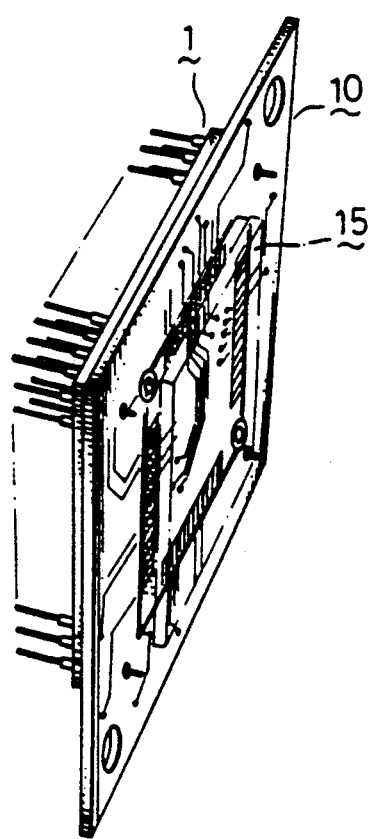
FIG. 2 is a perspective view thereof.
Figure 3:
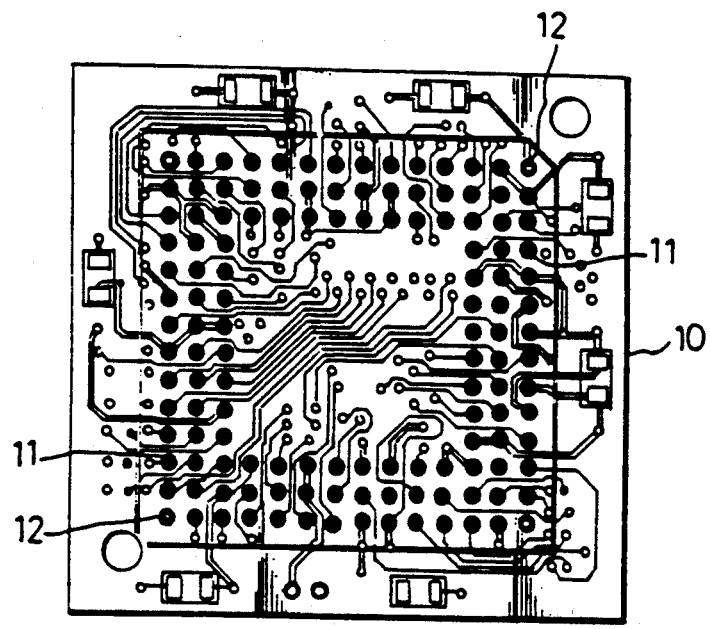
FIG. 3 is a top view of a printed circuit board according to the present invention.
Figure 4:
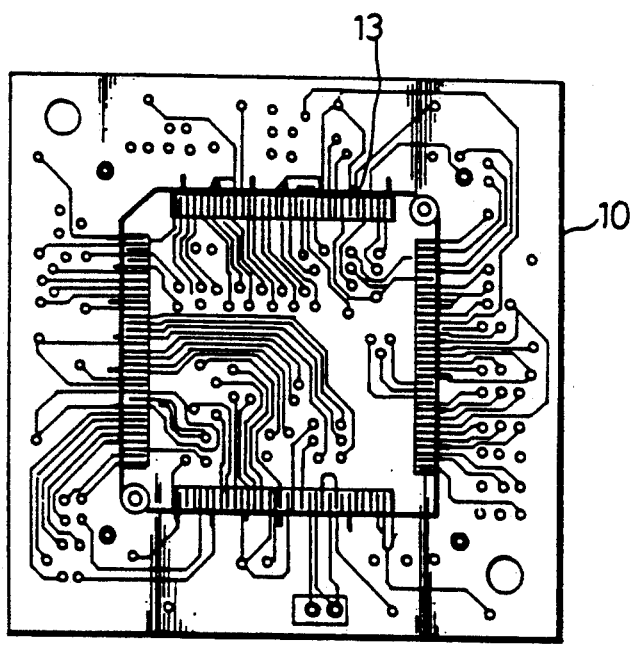
FIG. 4 is a bottom view of the printed circuit board of FIG. 3.
Figure 5:
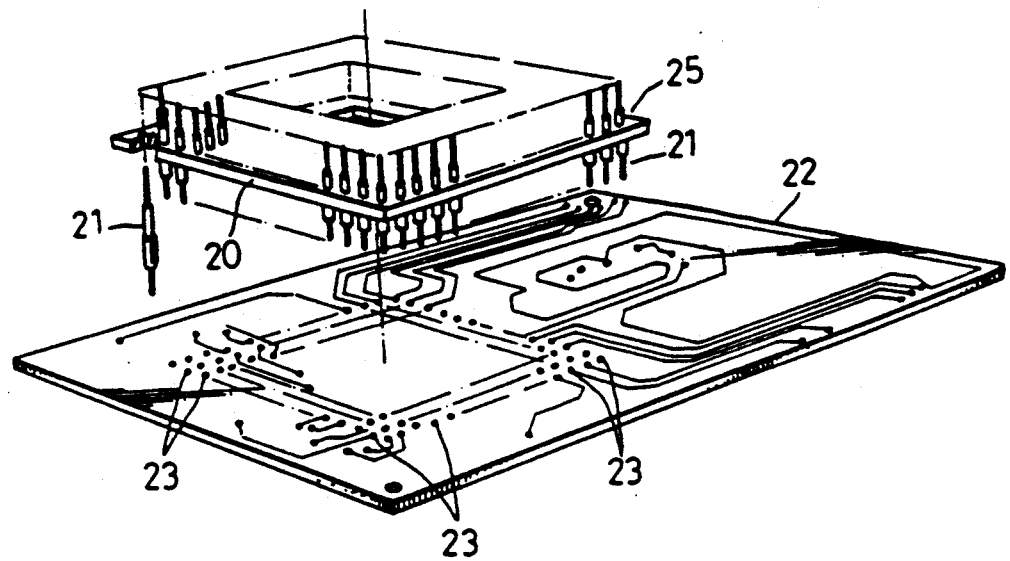
FIG. 5 is an exploded view of a prior art PGA adaptor mounting hardware.
Figure 6:
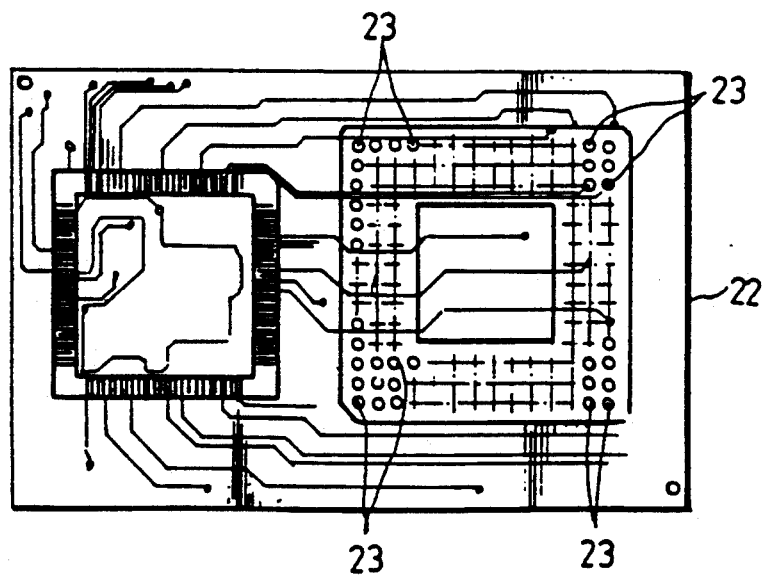
FIG. 6 is a top view of the prior art PGA adaptor mounting hardware.

Referring to FIGS. 1 through 4, a PGA (pin grid array) adapter mounting hardware is generally comprised of a PGA adaptor 1 and a printed circuit board 10. The printed circuit board 10 is covered with a layer of tin paste over the conductive points 11 and apertures 12 thereof. The PGA adaptor 1 is secured to the printed circuit board 10 by inserting double-head fastening pins 5 through holes (not shown) on the PGA adaptor 1 into corresponding apertures 12 on the printed circuit board 10. By means of the operation of a soldering apparatus, the contact terminals 4 of the contact pins 3 on the PGA adaptor 1 are respectively electrically connected to the conductive points 11 on the printed circuit board 10. The printed circuit board 10 further comprises a transistor circuit 13 on the opposite side thereof (see FIG. 4) electrically connected to the conductive points 11. By means of applying a layer of tin paste on the contact terminals of the transistor circuit 13, an IC 15 can be connected to the transistor circuit 13. Therefore, the PGA adaptor 1 is soldered to the printed circuit board 10 at one side without piercing therethrough, while the transistor circuit 13 is arranged on the printed circuit board 10 at an opposite side. This arrangement greatly reduces the manufacturing cost, and makes chip assembly process easy.

Referring to FIG. 1 and FIG. 1A again, the PGA adaptor 1 is comprised of a base 2 having a plurality of contact pins 3 pierced therethrough, and a plurality of double-head fastening pins 5 on the corners thereof, wherein said contact pins 3 each has a contact terminal 4 disposed in flush with the top edge of the base 2. By means of the double-head fastening pins 5, the PGA adaptor 1 can be conveniently fastened to the printed circuit board 10. The printed circuit board 10 adopts surface mounting technique, having one side for (Plastic Quad Flap Pack) PQFP mounting (for connecting component parts through surface mounting techniques) and an opposite side for PGA mounting (for connecting component parts by plug-in and soldering procedures). Therefore, the printed circuit board 10 has conductive points 11 at one side for connecting the contact terminals 4 of the contact pins 3 on the PGA adaptor 1 and apertures 12 at locations corresponding to the double-head fastening pins 5 for fastening the PGA adaptor 1, and a transistor circuit 13 on an opposite side of the printed circuit board 10 and connected to the conductive points 11 for mounting an IC 15.

As indicated, the contact terminals 4 of the contact pins 3 are disposed in flush with the top edge of the PGA adaptor 1 and directly soldered to the conductive points 11 on the printed circuit board 10; the printed circuit board 10 has pre-fabricated apertures 12 on the corners thereof for fastening the PGA adaptor 1 by double-head pins 5, and a transistor circuit 13 on the opposite side thereof electrically connected to the conductive points 11. Therefore, the printed circuit board 10 has one side for (Plastic Quad Flap Pack) mounting and the opposite side for PGA mounting. By means of the aforesaid arrangement, the present invention becomes inexpensive to manufacture and easy to assemble.

What is claimed is:

1. A pin grid array (PGA) adaptor mounting hardware comprising a PGA adaptor and a printed circuit board comprising:

said PGA adaptor comprises a body made from a flat plate having a plurality of double-head fastening pins at corners thereof and a plurality of contact pins at suitable locations, said contact pins being respectively vertically inserted through said body with contact terminals thereof disposed on a top edge on said body; said printed circuit board comprises a plurality of apertures for fastening said double-head fastening pins, a plurality of conductive points of a printed circuit on a top edge thereof for connecting the contact terminals of said contact pins, a transistor circuit on a bottom edge thereof at a location opposite to said printed circuit for mounting an IC, said transistor circuit being electrically connected to the conductive points of the printed circuit on the top edge thereof; and said printed circuit board is covered with a layer of tin paste over the apertures and the conductive points of said printed circuit, permitting said PGA adaptor to be connected thereto by inserting said double-head fastening pins into said apertures and soldering the contact terminals of said contact pins to the conductive points of said printed circuit.

2. The pin grid array (PGA) adaptor mounting hardware of claim 1, wherein the contact terminals of said contact pins are in flush with said body of said PGA adaptor.

* * * * *